United States Patent
Lee et al.

(10) Patent No.: US 9,885,744 B2
(45) Date of Patent: Feb. 6, 2018

(54) SYSTEM AND METHOD FOR DETECTING AN ABNORMAL WAVEFORM IN A POWER DISTRIBUTION SYSTEM

(75) Inventors: Sung-Woo Lee, Daejeon (KR); Bok-Nam Ha, Daejeon (KR); In-Yong Seo, Daejeon (KR); Dong-Wan Seo, Daejeon (KR); Moon-Jong Jang, Daejeon (KR); Won Namkoong, Daejeon (KR)

(73) Assignee: KOREA ELECTRIC POWER CORPORATION, Seoul (KR)

( * ) Notice: Subject to any disclaimer, the term of this patent is extended or adjusted under 35 U.S.C. 154(b) by 673 days.

(21) Appl. No.: 14/348,327

(22) PCT Filed: Sep. 30, 2011

(86) PCT No.: PCT/KR2011/007256
§ 371 (c)(1),
(2), (4) Date: Mar. 28, 2014

(87) PCT Pub. No.: WO2013/047928
PCT Pub. Date: Apr. 4, 2013

(65) Prior Publication Data
US 2014/0247055 A1    Sep. 4, 2014

(30) Foreign Application Priority Data

Sep. 29, 2011 (KR) .................. 10-2011-0098828

(51) Int. Cl.
*G01R 31/08* (2006.01)
*G01R 31/02* (2006.01)
*G01R 21/00* (2006.01)
*G01R 19/25* (2006.01)
*H02J 13/00* (2006.01)

(52) U.S. Cl.
CPC ......... *G01R 31/02* (2013.01); *G01R 19/2513* (2013.01); *G01R 31/08* (2013.01);
(Continued)

(58) Field of Classification Search
CPC .... G01R 31/021; G01R 31/08; G01R 31/005; G01R 31/2834; G01R 31/02; G01R 19/2513; H04B 2203/5445; H04B 10/0791
(Continued)

(56) References Cited

U.S. PATENT DOCUMENTS 5,237,511 A * 8/1993 Caird ..................... H02H 7/261
700/293
7,363,525 B2 * 4/2008 Biederman ............. H04L 12/10
709/230
(Continued)

FOREIGN PATENT DOCUMENTS

KR    10-2007-0074867 A    7/2007

OTHER PUBLICATIONS

International Search Report, w/ English translation thereof, issued in International Application No. PCT/KR2011/007256 dated Oct. 12, 2012.
(Continued)

*Primary Examiner* — Amy He
(74) *Attorney, Agent, or Firm* — McDermott Will & Emery LLP

(57) ABSTRACT

The present invention relates to a system and method for an abnormal waveform in a power distribution system that quickly transmits abnormal waveform-related data of a large size by changing a protocol according to data size. The system for detecting an abnormal power quality waveform comprises: a plurality of RTUs for measuring abnormal waveform when a waveform measuring signal received, and transmitting an abnormal waveform using a protocol set according to the size of the abnormal waveform; an FEP for transmitting the waveform measuring signal to an RTU installed in a failure section, and receiving and storing the
(Continued)

abnormal waveform from the RTU; a main server for transmitting the waveform measuring signal through the FEP to the RTU installed in the failure section, performing controlling to measure the abnormal waveform generated in the failure section, and receiving and displaying the abnormal waveform according to the waveform measuring signal.

8 Claims, 7 Drawing Sheets

(52) U.S. Cl.
CPC ........ *H02J 13/001* (2013.01); *H02J 13/0062* (2013.01); *Y02E 60/74* (2013.01); *Y02E 60/7838* (2013.01); *Y04S 10/30* (2013.01); *Y04S 10/40* (2013.01); *Y04S 10/527* (2013.01); *Y04S 40/124* (2013.01)

(58) Field of Classification Search
USPC ............. 324/539, 500, 537, 522; 702/60, 62
See application file for complete search history.

(56) References Cited

U.S. PATENT DOCUMENTS

| | | | |
|---|---|---|---|
| 8,930,153 B2* | 1/2015 | Kagan | G01R 22/10 324/115 |
| 2003/0162538 A1* | 8/2003 | Yoo | H04W 84/02 455/423 |
| 2004/0138786 A1* | 7/2004 | Blackett | G01D 4/00 700/295 |
| 2005/0005093 A1* | 1/2005 | Bartels | G06F 21/606 713/150 |
| 2006/0083260 A1* | 4/2006 | Wang | H04L 67/025 370/463 |
| 2007/0150214 A1* | 6/2007 | Qin | G01R 19/2513 702/60 |
| 2008/0312851 A1* | 12/2008 | Kagan | G01D 4/002 702/60 |
| 2009/0091472 A1* | 4/2009 | Ocondi | G08C 17/02 340/870.03 |

OTHER PUBLICATIONS

Kang-Seok Lee et al., "The Study on the Communication Method of Intelligent Distribution Management System for Distributed Generation Equipment," Journal of 2007 Fall Conference in Power Technology Part of KIEE, 2007; w/ English abstract.

B.N. Ha et al., "Online dada acquisition of power quality wave and fault wave by intelligent distribution automation system," Journal of 2010 Summer Conference in KIEE, 2010; w/ English abstract.

B.N. Ha et al., "The Functions and Characteristics of Distribution Automation System Components," Journal of 1996 Summer Conference in KIEE, 1996; w/ English abstract.

* cited by examiner

SYSTEM AND METHOD FOR DETECTING AN ABNORMAL WAVEFORM IN A POWER DISTRIBUTION SYSTEM

RELATED APPLICATIONS

This application is the U.S. National Phase under 35 U.S.C. §371 of International Application No. PCT/KR2011/007256, filed on Sep. 30, 2011, which in turn claims the benefit of Korean Application No. 10-2011-0098828, filed on Sep. 29, 2011, the disclosures of which Applications are incorporated by reference herein.

TECHNICAL FIELD

The present invention relates, in general, to a system and method for detecting an abnormal power quality waveform in a distribution system and, more particularly, to a system and method for detecting an abnormal power quality waveform in a distribution system, which measure online a voltage waveform, a current waveform, and an abnormal power quality waveform appearing in the fault section of the distribution system, and provide the measured waveforms to a user.

This application claims the benefit of Korean Patent Application No. 10-2011-0098828, filed on Sep. 29, 2011, which is hereby incorporated by reference in its entirety into this application.

BACKGROUND ART

Power quality denotes a degree in which supplied voltage and current deviate from an ideal sine wave, and factors influencing such power quality are divided into instantaneous voltage or current variations, and variations in voltage or current waveforms or harmonic distortion or low-frequency noise appearing for a relatively long time. Here, instantaneous voltage variations (sag, swell, and interruption) and transient voltage belong to the former, and harmonics, overvoltage, and undervoltage belong to the latter.

Fields of power quality diagnosis for analyzing power quality, and determining and predicting the stability of power have attracted attention since the late 80's, and are very interesting and important fields. In particular, in this period, the regulation of the power industry was lifted and high-performance equipment and high-precision systems were developed in foreign countries, so that consumers using power energy started to request the supply of high-quality power enabling their facilities or devices to be continuously and stably operated.

Thereafter, in the late 90's, high-efficiency power electronic devices, high-precision special motors, application semiconductor devices, etc. were developed, and automation equipment, office machines, data communication equipment, etc. based on microprocessors were rapidly developed, so that power quality problems started to attract attention in all fields using power energy, and thus the development of diagnosis analysis systems capable of simply and intuitively diagnosing and analyzing power quality has been required in the same industry.

In particular, in a distribution system, the inspection of the quality of power from a substation to each consumer must be essentially performed, and the selection of the quality monitoring location thereof is very important. If only a distribution system is taken into consideration, the power quality of extra-high power output from a substation, the power quality of secondary sides of a ground transformer and a pole transformer, and the power quality of high-voltage consumer and low-voltage consumer sides are important.

With the development of industry, a distribution system terminal device or main device has also continuously developed, and then the fast processing and transmission of information became possible. Accordingly, when a fault in the distribution system occurs, there is required an abnormal waveform monitoring system capable of measuring online a voltage waveform, a current waveform, and an abnormal power quality waveform in a fault section and allowing a user to rapidly and directly analyze such a fault.

However, such a conventional abnormal waveform monitoring system is problematic in that a Distributed Network Protocol (DNP) used upon measuring a file is vulnerable to the transmission of a large-capacity data file, and thus the system is not suitable for the transmission of a large-capacity data file such as waveform data. That is, the DNP used in the conventional abnormal waveform monitoring system requires a lot of time to transmit large-capacity data, such as a voltage waveform, a current waveform, and an abnormal waveform, so that the time required for the analysis of an abnormal waveform is increased, thus making it impossible to rapidly cope with an abnormal waveform (that is, a fault in a distribution system).

DISCLOSURE

Technical Problem

The present invention has been made keeping in mind the above problems occurring in the prior art, and an object of the present invention is to provide a system and method for the detecting an abnormal power quality waveform in a distribution system, which convert a data transfer protocol depending on the capacity of data, thus quickly transferring large-capacity abnormal waveform-related data.

Another object of the present invention is to provide a system and method for detecting an abnormal power quality waveform in a distribution system, which allow a user to quickly transfer online abnormal waveform-related data stored in a remote terminal device, thus allowing the user to easily monitor and utilize a voltage waveform, a current waveform, and an abnormal power quality waveform in a fault section online when a fault in the distribution system occurs.

Technical Solution

In order to accomplish the above objects, a system for detecting an abnormal power quality waveform in a distribution system according to an embodiment of the present invention includes a main server configured to, when a fault occurs in a distribution system, generate a waveform measurement signal, and receive, store, and display abnormal waveforms or voltages and currents of the distribution system measured in a fault section of the distribution system; a Front End Processor (FEP) configured to transmit the measurement signal generated by the main server to one or more Remote Terminal Units (RTUs) installed in the fault section, receive abnormal waveforms or voltages and currents of the distribution system from the one or more RTUs, and transmit the abnormal waveforms or the voltages and currents to the main server; and a plurality of RTUs, each being configured to, when the waveform measurement signal is received from the FEP, measure a voltage and a current of the distribution system, generate an abnormal waveform, convert the measured voltage and current or the abnormal waveform into data of a protocol format set based on request data included in the waveform measurement signal, and transmit resulting protocol format data.

The plurality of RTUs may be each configured to, if a measurement value including at least one of a current and a voltage measured from the distribution system is transmitted, set a protocol to a Distributed Network Protocol (DNP), whereas if an abnormal waveform is transmitted, set a protocol to a File Transfer Protocol (FTP).

The plurality of RTUs may be each configured to generate an abnormal waveform based on a current waveform and a voltage waveform measured in the fault section of the distribution system, and at least one of power qualities including harmonics, an instantaneous voltage sag, an instantaneous voltage swell, and an instantaneous interruption of a fault waveform measured in the fault section.

The plurality of RTUs may be each installed in a circuit breaker or a switch of the distribution system to measure at least one of a voltage and a current.

Each of the RTUs may include a measurement unit for, when the waveform measurement signal is received, measuring power qualities including harmonics, an instantaneous voltage sag, an instantaneous voltage swell, and an instantaneous interruption of a fault waveform, a current waveform, and a voltage waveform in the fault section of the distribution system, and generating an abnormal waveform; a protocol setting unit for setting a data transfer protocol with the FEP based on capacity of request data included in the waveform measurement signal; and a measurement control unit for performing control such that the measured voltage and current waveform or the abnormal waveform is transmitted to the FEP in conformity with the set data transfer protocol.

The FEP may calculate and stores an average load of a circuit breaker or a switch of an intelligent power distribution device based on the abnormal waveforms received from the plurality of RTUs, and transmit the calculated average load to the main server.

The main server may display the average load of the circuit breaker or the switch of the intelligent power distribution device received from the FEP.

The main server may display one or more phases selected from among a plurality of phases included in each abnormal waveform.

The main server may display at least one of a pre-stored abnormal waveform and pre-stored voltage and current of the distribution system.

In order to accomplish the above objects, a method for detecting an abnormal power quality waveform in a distribution system according to an embodiment of the present invention includes generating, by a Remote Terminal Unit (RTU), an abnormal waveform by measuring a voltage and a current in a fault section when a waveform measurement signal is received; setting, by the RTU, a protocol required for data transfer to the FEP based on request data included in the waveform measurement signal; transmitting, by the RTU, the generated abnormal waveform or the measured voltage and current to a main server through a Front End Processor (FEP) in conformity with the set protocol; and displaying, by the main server, the received abnormal waveform or the received voltage and current.

Measuring the abnormal waveform may be configured such that the RTU generates the abnormal waveform based on a current waveform and a voltage waveform measured in the fault section of the distribution system, and at least one of power qualities including harmonics, an instantaneous voltage sag, an instantaneous voltage swell, and an instantaneous interruption of a fault waveform measured in the fault section.

Setting the protocol may be configured such that, if a measurement value including at least one of the current and the voltage measured from the distribution system is transmitted, the RTU sets a protocol to a Distributed Network Protocol (DNP), whereas if the abnormal waveform is transmitted, the RTU sets a protocol to a File Transfer Protocol (FTP).

The method may further include, by the FEP, calculating an average load of a circuit breaker or a switch of an intelligent power distribution device.

The method may further include, by the main server, displaying the calculated average load of the circuit breaker or the switch.

The method may further include, by the main server, receiving and storing the transmitted abnormal waveform or the measured voltage and current, wherein displaying is configured such that the main server displays a pre-stored abnormal waveform or pre-stored voltage and current of the distribution system.

Advantageous Effects

In accordance with the present invention, a system and method for detecting an abnormal power quality waveform in a distribution system are advantageous in that a data transfer protocol is converted depending on the capacity of data to be transferred, thus quickly transferring large-capacity data such as a voltage waveform, a current waveform, and an abnormal power quality waveform.

Further, the system and method for detecting an abnormal power quality waveform in a distribution system are advantageous in that large-capacity data such as a voltage waveform, a current waveform, and an abnormal power quality waveform is quickly transferred, thus promptly recovering the fault section of the distribution system and improving the supply reliability of power.

Furthermore, the system and method for detecting an abnormal power quality waveform in a distribution system are advantageous in that, when a fault occurs, an abnormal waveform is detected and managed online by a terminal device and may be used as analytic data related to fault types or fault prediction.

Furthermore, the system and method for detecting an abnormal power quality waveform in a distribution system are advantageous in that, even in a state in which system and device accidents occur due to an instantaneous voltage sag caused by the automatic reclosing of a circuit breaker and the driving of a large-scale motor, an instantaneous voltage swell in a sound phase caused by the single line-ground fault accident of an ungrounded system, and an instantaneous voltage swell caused upon injecting a large-capacity capacitor bank into the system, and an instantaneous interruption occurs due to the malfunctioning of devices, abnormal waveform information is acquired from a terminal device installed in the distribution system and is transmitted to a higher-level main device, thus allowing the user to utilize the abnormal waveform information as analytic data for fault types and fault prediction.

Furthermore, the supply reliability indices of management standards are related to an interruption. In the past, only a System Average Interruption Duration Index (SAIDI) and a System Average Interruption Frequency Index (SAIFI) were managed, so that the supply reliability indices of management standards were not exactly assigned. However, since the system and method for detecting an abnormal power quality waveform in the distribution system may additionally manage a Customer Average Interruption Duration Index (CAIDI) and a Momentary Average Interruption Frequency Index (MAIFI), the supply reliability indices of management standards are more exactly assigned, thereby enabling the indices to be utilized as criteria required to impose electric charges.

BEST MODE

Figure 1:
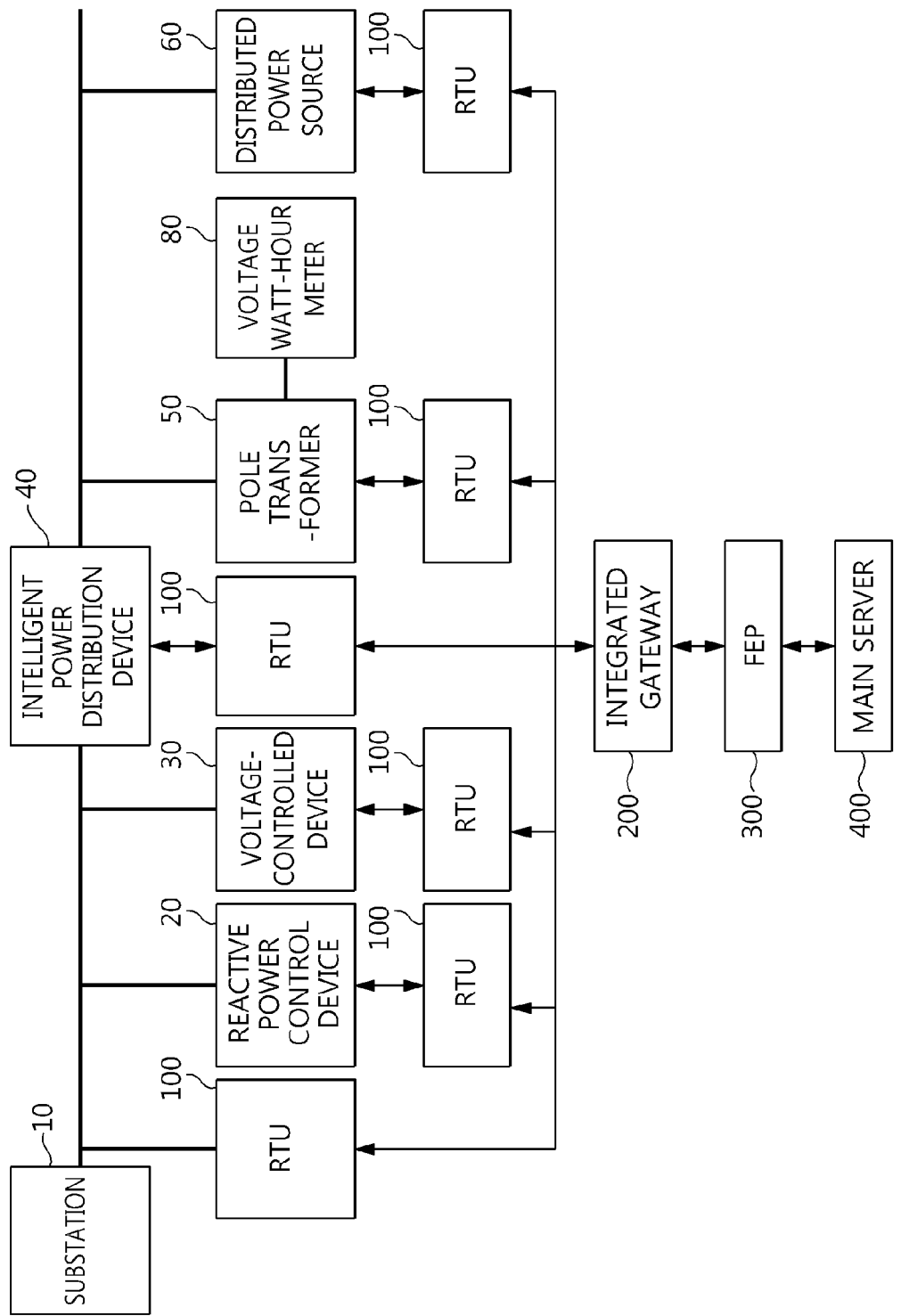
FIG. 1 is a diagram showing a system for detecting an abnormal power quality waveform in a distribution system according to an embodiment of the present invention.

Preferred embodiments of the present invention will be described with reference to the accompanying drawings in order to describe the present invention in detail so that those having ordinary knowledge in the technical field to which the present invention pertains can easily practice the technical spirit of the present invention. It should be noted that same reference numerals are used to designate the same elements even if they are depicted in different drawings, upon attaching reference numerals to the elements of the drawings. In the following description of the present invention, detailed descriptions of related known constructions or functions which are deemed to make the gist of the present invention obscure will be omitted.

Figure 2:
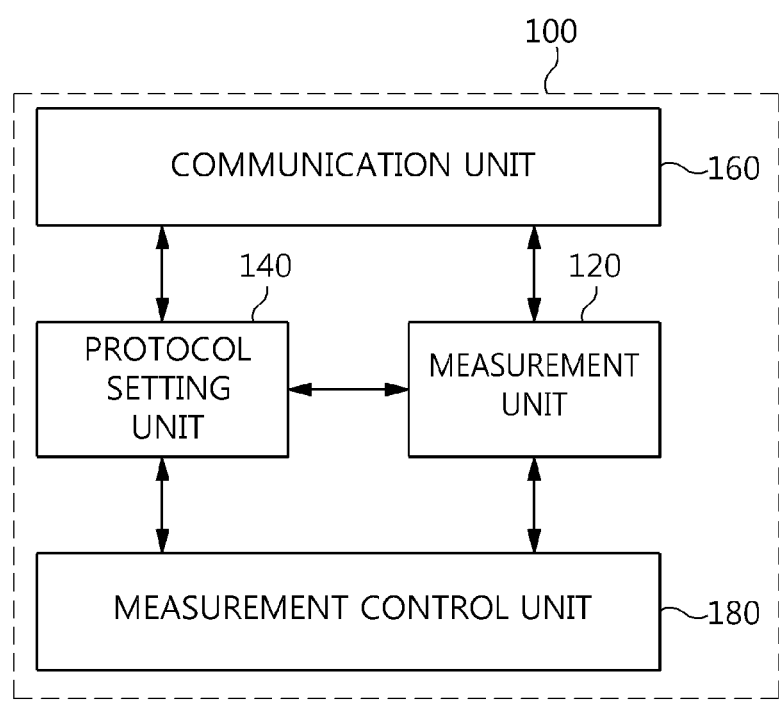
FIG. 2 is a diagram showing the Remote Terminal Unit (RTU) of FIG. 1.
Figure 3:
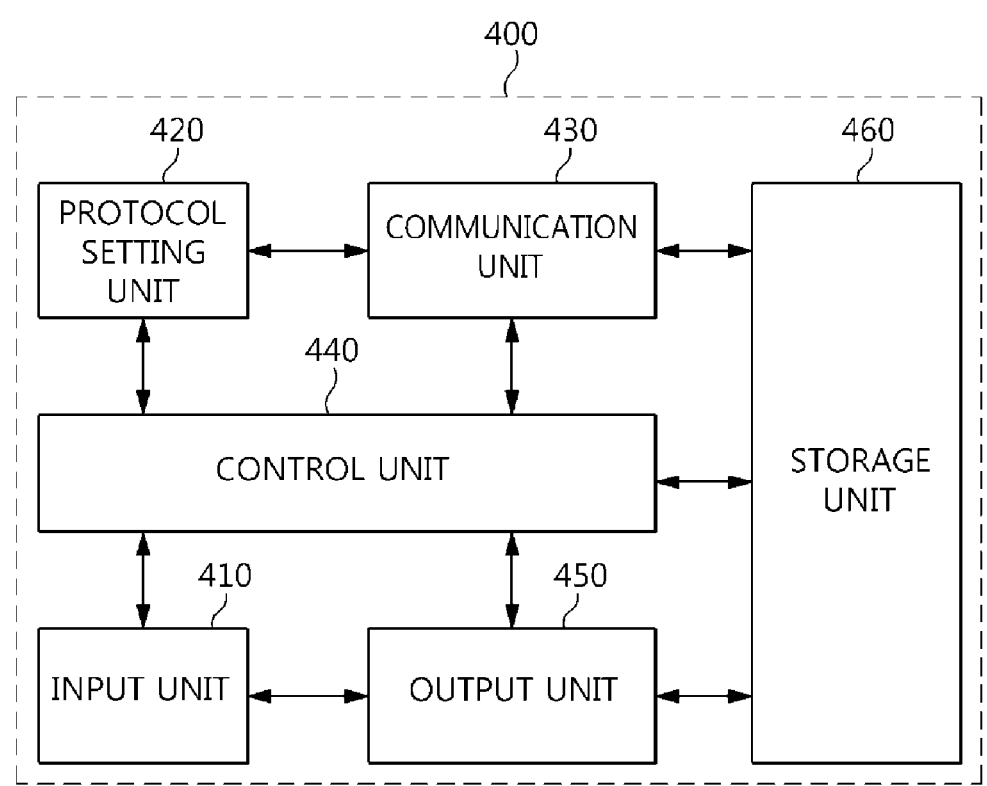
FIGS. 3 and 4 are diagrams showing the main server of FIG. 1.
Figure 4:
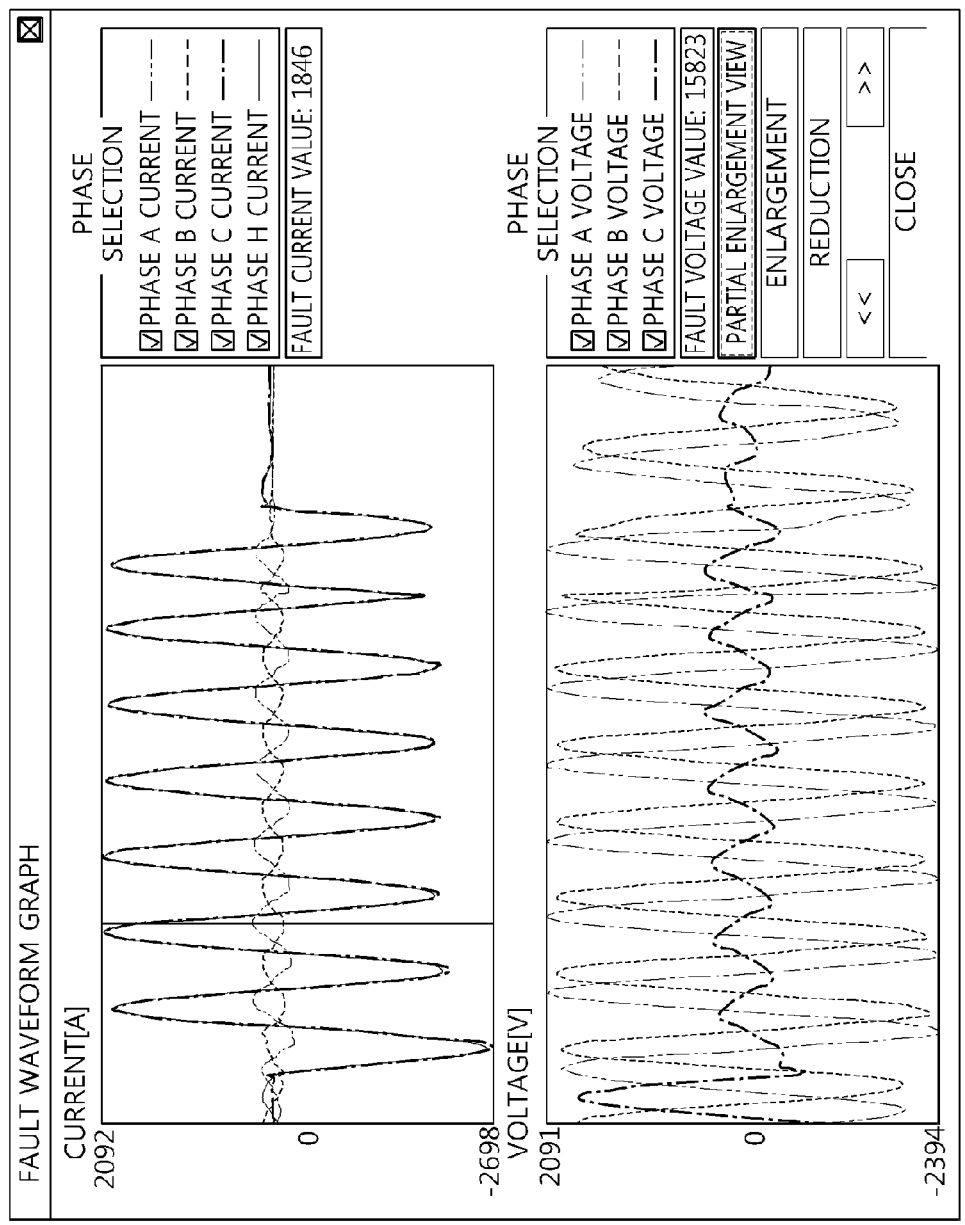

Hereinafter, a system for detecting an abnormal power quality waveform in a distribution system according to an embodiment of the present invention will be described in detail with reference to the attached drawings. FIG. 1 is a diagram showing a system for detecting an abnormal power quality waveform in a distribution system according to an embodiment of the present invention. FIG. 2 is a diagram showing the RTU of FIG. 1, and FIGS. 3 and 4 are diagrams showing the main server of FIG. 1.

As shown in FIG. 1, the distribution system according to the embodiment of the present invention includes a substation 10, a reactive power control device 20, a voltage-controlled device 30, an intelligent power distribution device 40, a pole transformer 50, a distributed power source 60, a high-voltage watt-hour meter 70, and a low-voltage watt-hour meter 80.

The substation 10 converts the properties of a voltage or a current in a procedure for transmitting power produced by a power plant to consumers through a power transmission line or a distribution line.

The reactive power control device 20 is a device for compensating for insufficient reactive power using a Shunt Capacitor (SC), thus recovering the voltage. That is, the reactive power control device 20 is configured to, when the consumption of reactive power (inductive power) is excessive in a heavy load, and a voltage sag is serious, inject power by stages for individual banks, and compensate for insufficient reactive power, thus recovering the voltage.

The voltage-controlled device 30, which is a kind of Automatic Voltage Regulator (AVR), is installed at the middle of the distribution line and is configured to automatically adjust the tap of a Semi-fixed Variable Resistor (SVR) depending on a change in voltage and maintain the voltage at a constant level.

The intelligent power distribution device 40 includes an Intelligence Remote Terminal Unit (I-RTU) and a communication device. Here, the I-RTU detects a fault in the distribution system, and blocks and recloses a fault section. The I-RTU automatically separates the fault section from the distribution system when the fault occurs in the distribution system, switches a sound section to another line in a branch, and reversely transmits power to the line, thus minimizing the occurrence of power interruptions.

The pole transformer 50 converts the voltage from a high voltage into a low voltage, and supplies the low voltage to low-voltage consumer equipment.

The distributed power source 60 plays an important role in a procedure for switching a power supply method from a vertical and unilateral supply method to a horizontal and bidirectional supply method, and includes a power source obtained from small-scale cogeneration, a new & renewable energy power source, etc.

The high-voltage watt-hour meter 70 detects power consumed by high-voltage consumer equipment. In this case, the high-voltage watt-hour meter 70 transmits the detected power consumption to a main server 400 through wireless communication.

The low-voltage watt-hour meter 80 detects the power consumption of consumers which consume electricity output from the pole transformer 50. In this case, the low-voltage watt-hour meter 80 transmits the detected power consumption to the main server 400 through wireless communication.

The system for detecting an abnormal power quality waveform in the distribution system according to an embodiment of the present invention includes a plurality of RTUs 100, an integrated gateway 200, a Front End Processor (FEP) 300, and the main server 400.

The RTUs 100 are distributed and installed in the distribution system and are each configured to measure a current waveform, a voltage waveform, and power quality in a fault section in the corresponding area. In this case, each RTU 100 measures power qualities including the harmonics, instantaneous voltage sag, instantaneous voltage swell, instantaneous interruption, etc. of a fault waveform.

The RTU 100 is configured to, when a waveform measurement signal generated by the main server 400 is received through the FEP 300, measure related values from the circuit breaker or the switch of the distribution system. Of course, the RTU 100 measures related values at the input end or the output end of each of pieces of power equipment, such as the substation 10, the reactive power control device 20, the voltage-controlled device 30, the intelligent power distribution device 40, the pole transformer 50, the distributed power source 60, the high-voltage watt-hour meter 70, and the low-voltage watt-hour meter 80 of the distribution system.

The RTU 100 generates an abnormal waveform using the current waveform, the voltage waveform, and the power quality measured in the fault section. That is, the RTU 100 generates the voltage waveform using measured voltages, and generates the current waveform using measured currents. The RTU 100 generates an abnormal waveform using the generated voltage waveform, the generated current waveform, and at least one of the harmonics, instantaneous voltage sag, instantaneous voltage swell, and instantaneous interruption of a fault waveform.

The RTU 100 transmits the generated abnormal waveform to the FEP 300 through the integrated gateway 200. That is, the RTU 100 sets a protocol for data communication with the FEP 300 based on the capacity of request data included in a waveform measurement signal. In this case, the RTU 100 is configured to, when a fault current and a fault voltage generated in the fault section of the distribution system are transmitted to the FEP 300 in the occurrence of a fault, set the protocol to a Distributed Network Protocol (DNP). The RTU 100 is configured to, when the generated abnormal waveform is transmitted, set the protocol to a File Transfer Protocol (FTP). That is, when small-capacity data such as measurement values (that is, a fault current and a fault voltage) is transmitted, the RTU 100 sets the DNP. When large-capacity data such as the abnormal waveform (that is, a fault current waveform, a fault voltage waveform, power quality, etc.) is transmitted, the RTU 100 sets a Transmission Control Protocol (TCP). In this way, the RTU 100 sets the data transfer protocol based on the capacity of data to be transferred to the FEP 300.

The RTU 100 measures voltages or currents at the input end and the output end of each of devices (that is, the substation 10, the reactive power control device 20, the voltage-controlled device 30, the intelligent power distribution device 40, the pole transformer 50, the distributed power source 60, the high-voltage watt-hour meter 70, the low-voltage watt-hour meter 80, etc.) of a normally operated distribution system. In this case, the RTU 100 transmits the waveform of voltages or currents measured, in a normal operation state, as an instantaneous waveform to the FEP 300.

For this, as shown in FIG. 2, the RTU 100 includes a measurement unit 120 for, when a waveform measurement signal is received from the FEP 300, measuring a current waveform, a voltage waveform, and power qualities including the harmonics, instantaneous voltage sag, instantaneous voltage swell, and instantaneous interruption of a fault waveform in the fault section of the distribution system, and generating an abnormal waveform, a protocol setting unit 140 for setting a data transfer protocol with the FEP 300 based on the capacity of request data included in the waveform measurement signal, and a measurement control unit 180 for performing control such that the measured voltage and current waveform or the measured abnormal waveform is transmitted to the FEP 300 in conformity with the set data transfer protocol. Here, when the main server 400 which will be described later sets a protocol, the protocol setting unit 140 may be excluded from the configuration of the RTU 100.

The integrated gateway 200 is implemented using a wired/wireless network and is configured to transfer data between the RTU 100 and the FEP 300. The integrated gateway 200 transfers data between the RTU 100 and the FEP 300 using a Distributed Network Protocol (DNP) and a File Transfer Protocol (FTP).

The FEP 300 transmits/receives data to/from the plurality of RTUs 100 through the integrated gateway 200. That is, the FEP 300 transfers a waveform measurement signal received from the main server 400 to the corresponding RTU 100. In this case, the FEP 300 transfers the waveform measurement signal to each RTU 100 installed in the fault section among the plurality of RTUs 100.

The FEP 300 receives an abnormal waveform from the RTU 100 which received the waveform measurement signal. That is, the FEP 300 receives an abnormal waveform including a current waveform or a voltage waveform from the RTU 100 installed in the fault section. In this case, the FEP 300 stores the abnormal waveform and then transmits the abnormal waveform to the main server 400.

The FEP 300 may receive instantaneous waveforms from the RTUs 100 and store the instantaneous waveforms. That is, the FEP 300 may receive and store each instantaneous waveform implemented as a voltage waveform or a current waveform measured from a normally operated distribution system. Of course, the FEP 300 may transmit the instantaneous waveform to the main server 400 if a request from the main server 400 is received.

The FEP 300 calculates the average load of the intelligent power distribution device 40 based on the abnormal waveforms received from the plurality of RTUs 100. That is, the FEP 300 calculates the average load of the circuit breaker or switch of the intelligent power distribution device 40 based on the abnormal waveforms. The FEP 300 stores the calculated average load of the circuit breaker or switch and thereafter transmits the average load to the main server 400.

The main server 400 displays the abnormal waveform received from the FEP 300. That is, the main server 400 generates a waveform measurement signal for the measurement and transmission of an abnormal waveform. In this case, the main server 400 generates a waveform measurement signal having voltages and currents or an abnormal waveform as request data. That is, in order to receive the voltages and currents of the distribution system, the main server 400 generates a waveform measurement signal including voltages and currents as request data. In order to receive the abnormal waveform of the distribution system, the main server 400 generates a waveform measurement signal including an abnormal waveform as request data. The main server 400 requests each RTU 100 installed in the fault section to measure and transmit an abnormal waveform by transmitting the generated waveform measurement signal to the RTU 100 installed in the fault section through the FEP 300.

The main server 400 displays the abnormal waveform received from each RTU 100 in the fault section through the FEP 300. That is, the main server 400 displays abnormal waveforms or the voltages and currents received through the FEP 300. The main server 400 may also display abnormal waveforms or voltages and currents previously received through the FEP 300 and then stored. In this case, the main server 400 may display one or more phases selected from among a plurality of phases included in each abnormal waveform. The main server 400 stores and manages abnormal waveforms.

The main server 400 may receive instantaneous waveforms measured by the plurality of RTUs 100 through the FEP 300 and may display the instantaneous waveforms. That is, the main server 400 receives and displays instantaneous waveforms which are waveforms of voltages and currents measured at regular intervals when the distribution system is normally operated. In this case, the main server 400 may also display one or more phases selected from among a plurality of phases included in each instantaneous waveform. The main server 400 stores and manages the instantaneous waveform.

The main server 400 displays the average load of the intelligent power distribution device 40 received from the FEP 300. That is, the main server 400 receives the average load of the circuit breaker or switch of the intelligent power distribution device 40 from the FEP 300. The main server 400 displays the received average load of the circuit breaker or switch. In this regard, the main server 400 stores and manages the received average load.

For this, as shown in FIG. 3, the main server 400 includes an input unit 410 for receiving information required to generate control information necessary for the control of the distribution system, a protocol setting unit 420 for setting a data transfer protocol between the plurality of RTUs 100 and the FEP 300, a communication unit 430 for transmitting/ receiving data to/from the FEP 300, a control unit 440 for controlling the distribution system in response to input (or stored) control information, and generating a waveform measurement signal required to request the measurement of an abnormal waveform, an output unit 450 for displaying various types of information, and a storage unit 460 for storing distribution system information including the control information for the distribution system, abnormal waveforms, instantaneous waveforms, etc. In this case, as shown in FIG. 4, the output unit 450 displays an abnormal waveform for currents (that is, a fault waveform) on an upper portion thereof and displays an abnormal waveform for voltages on a lower portion thereof. In this case, the output unit 450 may selectively display the phases of the waveform according to the input of the user, and may also display the value of a fault current and the magnitude of a fault voltage together with the phases. In this case, when the above-described RTU 100 sets a protocol, the protocol setting unit 420 may be excluded from the components of the main server 400.

Figure 5:
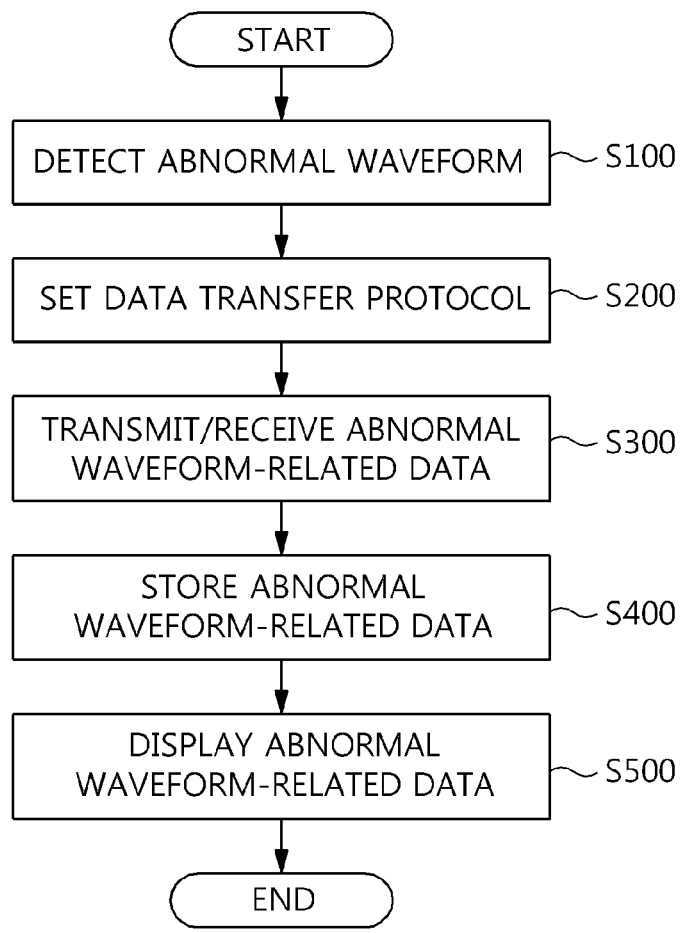
FIG. 5 is a flowchart showing a method for detecting an abnormal power quality waveform in a distribution system according to an embodiment of the present invention.
Figure 6:
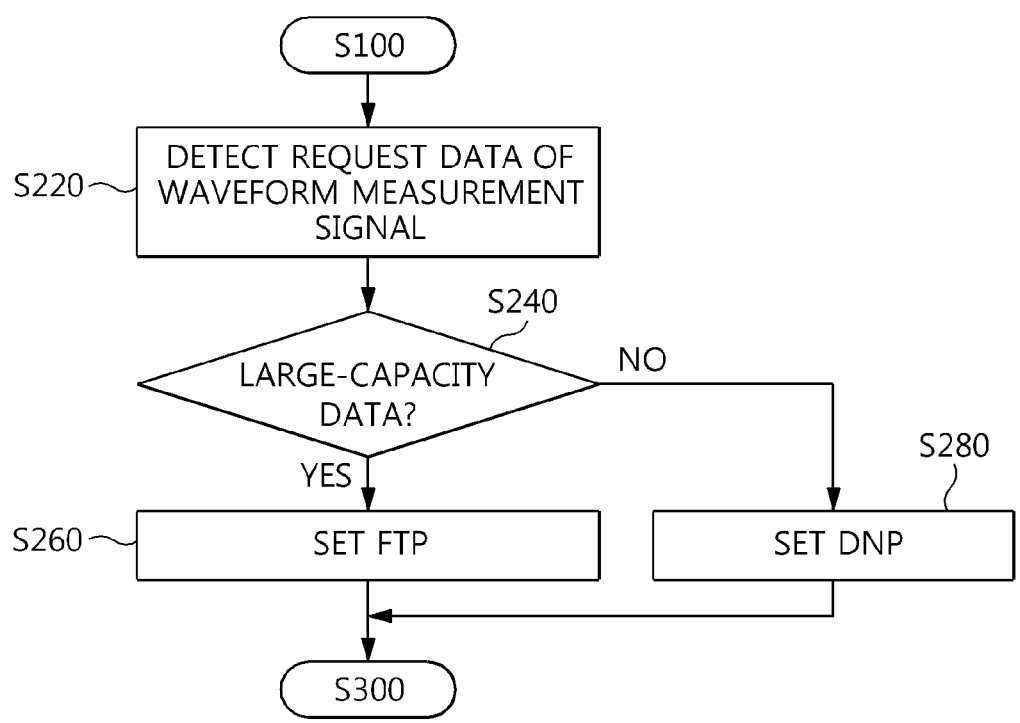
FIG. 6 is a flowchart showing the data transfer protocol setting step of FIG. 5.
Figure 7:
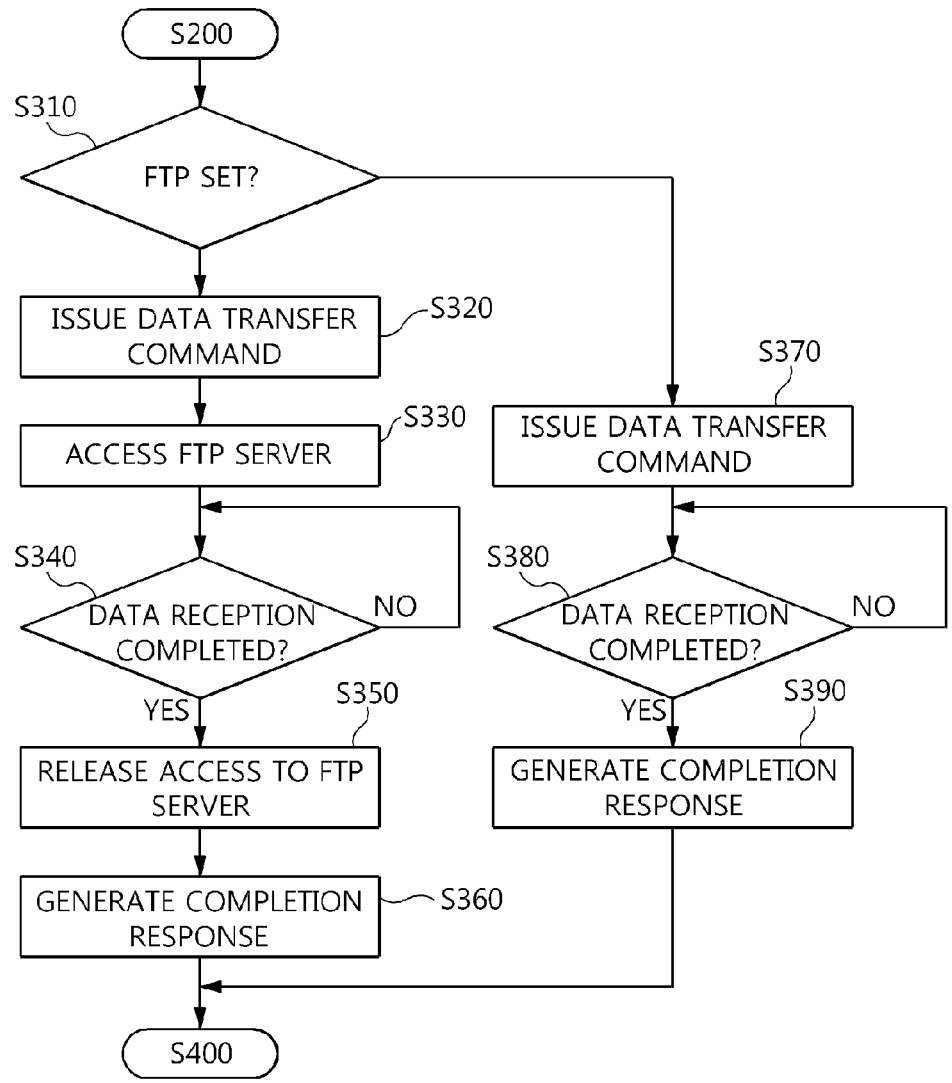
FIG. 7 is a flowchart showing the abnormal waveform-related data transmission/reception step of FIG. 5.

Hereinafter, a method for detecting an abnormal power quality waveform in the distribution system according to an embodiment of the present invention will be described in detail with reference to the attached drawings. FIG. 5 is a flowchart showing a method for detecting an abnormal power quality waveform in a distribution system according to an embodiment of the present invention, FIG. 6 is a flowchart showing the data transfer protocol setting step of FIG. 5, and FIG. 7 is a flowchart showing the abnormal waveform-related data transmission/reception step of FIG. 5.

First, the main server 400 generates a waveform measurement signal required to measure an abnormal waveform in the fault section of the distribution system. The main server 400 transmits the generated waveform measurement signal to the FEP 300. The FEP 300 transfers the received waveform measurement signal to each RTU 100 installed in the fault section through the integrated gateway 200. In this case, the FEP 300 converts the waveform measurement signal into a DNP format signal and transmits it to the RTU 100. Accordingly, the RTU 100 that received the waveform measurement signal measures an abnormal waveform including voltages and currents in the corresponding section at step S100.

The RTU 100 sets a protocol required to transfer the measured abnormal waveform to the FEP 300 at step S200. In this case, the RTU 100 sets a protocol to a TCP when a waveform measurement signal requesting an abnormal waveform is received. The RTU 100 sets a protocol to a DNP when a waveform measurement signal requesting voltage or current measurement values is received. This operation will be described in greater detail below with reference to the attached drawing.

The RTU 100 detects the capacity of request data included in the waveform measurement signal received from the FEP 300 at step S220. In this case, the RTU 100 detects the capacity as large capacity in the case of the waveform measurement signal requesting the abnormal waveform. The RTU 100 detects the capacity as small capacity in the case of the waveform measurement signal requesting measurement values.

If the detected request data capacity is large capacity (Yes at step S240), the RTU 100 sets an FTP at step S260. That is, the RTU 100 transmits data using the FTP upon transmitting large-capacity data such as an abnormal waveform.

If the detected request data capacity is small capacity, the RTU 100 sets an existing DNP used to transmit measurement data at step S280. That is, the RTU 100 transmits data using the DNP upon transmitting small-capacity data such as voltage and current measurement values.

In this case, the RTU 100 may transmit data using a protocol set by the user. That is, the user selects one of the FTP and the DNP via the main server 400. The main server 400 transmits the protocol selected by the user to RTUs 100 through the FEP 300, and then allows the protocol to be set.

The RTU 100 converts abnormal waveform-related data (that is, the abnormal waveform and measurement values) into preset protocol format data. The RTU 100 transmits the converted abnormal waveform-related data to the integrated gateway 200 over a network. The integrated gateway 200 transmits the received abnormal waveform-related data to the FEP 300. The FEP 300 transmits abnormal waveform-related data received from one or more RTUs 100 installed in the fault section of the distribution system to the main server at step S300. In order to analyze the fault (that is, abnormal waveform) in the distribution system, abnormal waveforms (that is, fault waveforms), instantaneous waveforms, etc., stored in response to faults or user requests must be received from RTUs 100 located at a remote place. In this case, it is possible to transmit abnormal waveform-related data even if the DNP (distribution protocol) currently being used in the distribution system is utilized. However, the DNP is not suitable for the transmission of large-capacity data. In detail, the DNP requires much time to receive one piece of abnormal waveform-related data, thus consuming a lot of time in analyzing faults. Therefore, the present invention uses a hybrid-type waveform data transmission scheme which combines a File Transfer Protocol (FTP) with an existing DNP communication protocol so as to promptly acquire a data file.

This will be described in detail below with reference to the attached drawing.

If the FTP is set (Yes at S310), the main server 400 issues a data transfer command to the corresponding RTU 100 at step S320. Accordingly, the RTU 100 and the FEP 300 access an FTP server, and transmit/receive the abnormal waveform-related data to/from the FTP server at step S330. The FEP 300 transmits the abnormal waveform-related data received through the FTP server to the main server 400. Of course, the RTU 100 and the main server 400, instead of the FEP 300, may access the FTP server and directly transmit/ receive abnormal waveform-related data.

If the reception of data by the main server 400 has been completed (Yes at step S340), the RTU 100 and the FEP 300 release access to the FTP server at step S350. If the RTU 100 and the main server 400 have accessed the FTP server, the RTU 100 and the main server 400 release access to the FTP server.

The main server 400 notifies the corresponding RTU 100 that the reception of the abnormal waveform-related data has been completed, by means of a completion response message at step S360.

If the DNP has been set, the main server 400 issues a data transmission command to the corresponding RTU 100 at step S370. Accordingly, the RTU 100 and the FEP 300 transmit/receive abnormal waveform-related data via the DNP. If the reception of data has been completed (Yes at S380), the main server 400 notifies the corresponding RTU 100 that the reception of the abnormal waveform-related data has been completed, by means of a completion response message at step S390.

The FEP 300 stores the abnormal waveform-related data received from the one or more RTUs 100. The main server 400 stores the abnormal waveform-related data received through the FEP 300 at step S400. The main server 400 displays the received abnormal waveform-related data at step S500.

As described above, a system and method for detecting an abnormal power quality waveform in a distribution system are advantageous in that a data transfer protocol is converted depending on the capacity of data to be transferred, thus quickly transferring large-capacity data such as a voltage waveform, a current waveform, and an abnormal power quality waveform.

Further, the system and method for detecting an abnormal power quality waveform in a distribution system are advantageous in that large-capacity data such as a voltage waveform, a current waveform, and an abnormal power quality waveform is quickly transferred, thus promptly recovering the fault section of the distribution system and improving the supply reliability of power.

Furthermore, the system and method for detecting an abnormal power quality waveform in a distribution system are advantageous in that, when a fault occurs, an abnormal waveform is detected and managed online by a terminal device and may be used as analytic data related to fault types or fault prediction.

Furthermore, the system and method for detecting an abnormal power quality waveform in a distribution system are advantageous in that, even in a state in which system and device accidents occur due to an instantaneous voltage sag caused by the automatic reclosing of a circuit breaker and the driving of a large-scale motor, an instantaneous voltage swell in a sound phase caused by the single line-ground fault accident of an ungrounded system, and an instantaneous voltage swell caused upon injecting a large-capacity capacitor bank into the system, and an instantaneous interruption occurs due to the malfunctioning of devices, abnormal waveform information is acquired from a terminal device installed in the distribution system and is transmitted to a higher-level main device, thus allowing the user to utilize the abnormal waveform information as analytic data for fault types and fault prediction.

Furthermore, the supply reliability indices of management standards are related to an interruption. In the past, only a System Average Interruption Duration Index (SAIDI) and a System Average Interruption Frequency Index (SAIFI) were managed, so that the supply reliability indices of management standards were not exactly assigned. However, since the system and method for detecting an abnormal power quality waveform in the distribution system may additionally manage a Customer Average Interruption Duration Index (CAIDI) and a Momentary Average Interruption Frequency Index (MAIFI), the supply reliability indices of management standards are more exactly assigned, thereby enabling the indices to be utilized as criteria required to impose electric charges.

Although embodiments of the present invention have been described, the present invention may be modified in various forms, and those skilled in the art will appreciate that various modifications and changes may be implemented without departing from the spirit and scope of the accompanying claims.

The invention claimed is:

1. A system for detecting an abnormal power quality waveform in a distribution system, comprising:
a main server configured to, when a fault occurs in a distribution system, generate a waveform measurement signal;
a Front End Processor (FEP) configured to transmit the measurement signal generated by the main server to one or more Remote Terminal Units (RTUs) installed in the fault section, receive abnormal waveforms or voltages and currents of the distribution system from the one or more RTUs, and transmit the abnormal waveforms or the voltages and currents to the main server; and
a plurality of RTUs, each being configured to, when the waveform measurement signal is received from the FEP, measure a voltage and a current of the distribution system, generate an abnormal waveform, convert the measured voltage and current or the generated abnormal waveform into data of a protocol format set based on request data included in the waveform measurement signal, and transmit resulting protocol format data,
wherein the main server receives, stores, and displays the abnormal waveforms or the voltages and currents of the distribution system measured in the fault section of the distribution system,
wherein the abnormal waveforms or the voltages and currents are the sum of the measured voltage and current or the generated abnormal waveform from each of the plurality of RTUs, and
wherein each of the RTUs comprises a processor, the processor including:
a measurement unit for, when the waveform measurement signal is received, measuring power qualities including harmonics, an instantaneous voltage sag, an instantaneous voltage swell, and an instantaneous interruption of a fault waveform, a current waveform, and a voltage waveform in the fault section of the distribution system, and generating an abnormal waveform;
a protocol setting unit for setting a data transfer protocol with the FEP based on capacity of request data included in the waveform measurement signal; and
a measurement control unit for performing control such that the measured voltage and current waveform or the abnormal waveform is transmitted to the FEP in conformity with the set data transfer protocol.

2. The system of claim 1, wherein the plurality of RTUs are each configured to, if a measurement value including at least one of a current and a voltage measured from the distribution system is transmitted, set a protocol to a Distributed Network Protocol (DNP), whereas if an abnormal waveform is transmitted, set a protocol to a File Transfer Protocol (FTP).

3. The system of claim 1, wherein the plurality of RTUs are each configured to generate an abnormal waveform based on a current waveform and a voltage waveform measured in the fault section of the distribution system, and at least one of power qualities including harmonics, an instantaneous voltage sag, an instantaneous voltage swell, and an instantaneous interruption of a fault waveform measured in the fault section.

4. The system of claim 1, wherein the plurality of RTUs are each installed in a circuit breaker or a switch of the distribution system to measure at least one of a voltage and a current.

5. The system of claim 1, wherein the FEP calculates and stores an average load of a circuit breaker or a switch of an intelligent power distribution device based on the abnormal waveforms received from the plurality of RTUs, and transmits the calculated average load to the main server.

6. The system of claim 5, wherein the main server displays the average load of the circuit breaker or the switch of the intelligent power distribution device received from the FEP.

7. The system of claim 5, wherein the main server displays one or more phases selected from among a plurality of phases included in each abnormal waveform.

8. The system of claim 1, wherein the main server displays at least one of a pre-stored abnormal waveform and pre-stored voltage and current of the distribution system.

* * * * *